US012803505B2

United States Patent

(12) United States Patent
Elyasi et al.

(10) Patent No.: US 12,803,505 B2
(45) Date of Patent: Nov. 17, 2026

(54) PRE-DISTORTION TRAINING FEEDBACK VIA INDUCTIVE COUPLING

(71) Applicant: QUALCOMM Incorporated, San Diego, CA (US)

(72) Inventors: Hedieh Elyasi, Redwood City, CA (US); Mazhareddin Taghivand, San Jose, CA (US); Sang Oh Lee, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 40 days.

(21) Appl. No.: 18/883,156

(22) Filed: Sep. 12, 2024

(65) Prior Publication Data

US 2025/0247057 A1 Jul. 31, 2025

Related U.S. Application Data

(60) Provisional application No. 63/627,022, filed on Jan. 30, 2024.

(51) Int. Cl.
*H03F 1/32* (2006.01)
*H04B 1/04* (2006.01)

(52) U.S. Cl.
CPC ......... *H03F 1/3247* (2013.01); *H04B 1/0475* (2013.01); *H03F 2200/273* (2013.01);
(Continued)

(58) Field of Classification Search
CPC .......... H04B 1/04; H04B 1/0475; H04B 1/38; H04B 1/40; H04B 1/403; H04B 1/408;
(Continued)

(56) References Cited

U.S. PATENT DOCUMENTS 8,699,620 B1 * 4/2014 Wu ........................ H03F 1/3247 375/296
2013/0207741 A1 8/2013 Presti
(Continued)

FOREIGN PATENT DOCUMENTS

EP 3300259 A1 3/2018

OTHER PUBLICATIONS

Partial International Search Report—PCT/US2025/011142—ISA/EPO—Apr. 29, 2025.
(Continued)

*Primary Examiner* — Young T. Tse
(74) *Attorney, Agent, or Firm* — Dinsmore & Shohl LLP/Qualcomm

(57) ABSTRACT

Certain aspects of the present disclosure provide techniques for pre-distortion training feedback via inductive coupling. An example apparatus includes a receive path; a transmit path comprising an amplifier having a first output that is inductively coupled to the receive path; a memory; and a processor coupled to the memory. The processor is configured to cause the apparatus to obtain a first signal, based on a second signal output by the amplifier, via the receive path being inductively coupled to the first output of the amplifier; determine a parameter for pre-distortion associated with the amplifier based at least in part on the first signal; pre-distort a third signal based at least in part on the parameter; amplify the pre-distorted third signal via the amplifier; and transmit the amplified third signal.

16 Claims, 7 Drawing Sheets

(52) U.S. Cl.
CPC .................. *H03F 2200/294* (2013.01); *H03F 2201/3233* (2013.01); *H04B 2001/0425* (2013.01)

(58) Field of Classification Search
CPC ............ H04B 1/581; H04B 2001/0425; H03F 1/3211; H03F 1/3247; H03F 3/20; H03F 3/24; H03F 3/45; H03F 2200/273; H03F 2200/274; H03F 2200/541; H03F 2201/3233
USPC ........ 375/219–222, 254, 257, 258, 283–285, 375/296, 297, 306–308; 330/262, 292, 330/85, 86; 381/94.1
See application file for complete search history.

(56) References Cited

U.S. PATENT DOCUMENTS

| | | | | |
|---|---|---|---|---|
| 2016/0065147 | A1* | 3/2016 | Pratt | H03F 3/195<br>330/75 |
| 2016/0261295 | A1* | 9/2016 | Astrom | H04B 17/11 |
| 2017/0033915 | A1* | 2/2017 | McCoy | H03F 1/3247 |
| 2021/0320646 | A1* | 10/2021 | Ryu | H03H 7/25 |
| 2021/0399690 | A1* | 12/2021 | Panseri | H03F 3/19 |
| 2022/0407556 | A1* | 12/2022 | Braun | H04B 1/0475 |
| 2023/0253990 | A1 | 8/2023 | Singh et al. | |
| 2024/0014833 | A1* | 1/2024 | Henzler | H03F 3/19 |

OTHER PUBLICATIONS

International Search Report and Written Opinion—PCT/US2025/011142—ISA/EPO—Jul. 11, 2025.

* cited by examiner

PRE-DISTORTION TRAINING FEEDBACK VIA INDUCTIVE COUPLING

CROSS-REFERENCE TO RELATED APPLICATION(S)

The present Application for Patent claims benefit of U.S. Provisional Application No. 63/627,022, filed Jan. 30, 2024, which is hereby expressly incorporated by reference herein in its entirety.

INTRODUCTION

Field of the Disclosure

Aspects of the present disclosure relate to wireless communications, and more particularly, to pre-distortion training.

Description of Related Art

Wireless communications systems are widely deployed to provide various telecommunication services such as telephony, video, data, messaging, broadcasts, etc. These wireless communications systems may employ multiple-access technologies capable of supporting communications with multiple users by sharing available wireless communications system resources with those users. Wireless communication devices may communicate RF signals via any of various suitable radio access technologies (RATs) including, but not limited to, 5G New Radio (NR), Evolved Universal Terrestrial Radio Access (E-UTRA), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., Institute of Electrical and Electronics Engineers (IEEE) 802.11 specifications), any future RAT, and/or the like.

In certain cases, a wireless communications device is equipped with a radio frequency (RF) transceiver (also referred to as an RF front-end) for communicating RF signals. In general, a baseband signal is modulated to convey information using a modulation technique, such as phase-shift keying (PSK) or any other suitable modulation technique. In a transmit mode, the RF transceiver is responsible for multiplexing the baseband signal with an RF carrier signal that is transmitted over the air (e.g., a wireless communication channel). Such an operation is called upconversion. In a receive mode, the RF transceiver converts a received RF signal to the baseband signal. Such an operation is called downconversion. The received baseband signal then can be demodulated into the information encoded at a transmitter. The RF transceiver may include a cascade of components in a transmit chain and a receive chain, respectively. The cascade of components may include, for example, one or more of attenuators, switches, couplers, filters, mixers, amplifiers, frequency synthesizers, oscillators, antenna tuners, duplexers, diplexers, detectors, etc.

Although there have been great technological advancements in RF circuitry over many years, challenges still exist. For example, certain RF circuitry, such as amplifiers, have non-linear characteristics. Accordingly, there is a continuous desire to improve the technical performance of RF circuitry, such as amplifiers via pre-distortion.

SUMMARY

Certain aspects provide an apparatus configured for wireless communications. The apparatus includes a receive path comprising a variable resistive element. The apparatus further includes a transmit path comprising a first amplifier having a first output that is inductively coupled to the receive path. The apparatus further includes one or more memories. The apparatus includes one or more processors coupled to the one or more memories, the receive path, and the transmit path. The one or more processors are configured to cause the apparatus to obtain a first signal, based on a second signal output by the first amplifier, via the receive path being inductively coupled to the first output of the first amplifier, wherein the variable resistive element is configured to adjust an attenuation applied to the first signal via a variable resistance of the variable resistive element; determine one or more parameters for digital pre-distortion (DPD) associated with the first amplifier based at least in part on the first signal; pre-distort a third signal based at least in part on the one or more parameters; amplify the pre-distorted third signal via the first amplifier; and transmit the amplified third signal.

Certain aspects provide a method for wireless communications by an apparatus. The method includes obtaining a first signal, based on a second signal output by a first amplifier of a transmit path, via a receive path being inductively coupled to an output of the first amplifier, the receive path comprising a variable resistive element configured to adjust an attenuation applied to the first signal via a variable resistance of the variable resistive element. The method further includes determining one or more parameters for digital pre-distortion (DPD) associated with the first amplifier based at least in part on the first signal. The method further includes pre-distorting a third signal based at least in part on the one or more parameters. The method further includes amplifying the pre-distorted third signal via the first amplifier. The method further includes transmitting the amplified third signal.

Certain aspects provide an apparatus configured for wireless communications. The apparatus includes a receive path and a transmit path comprising a first amplifier having a first output that is inductively coupled to the receive path. The apparatus further includes one or more memories and one or more processors coupled to the one or more memories, the receive path, and the transmit path. The one or more processors are configured to cause the apparatus to obtain a first signal, based on a second signal output by the first amplifier, via the receive path being inductively coupled to the first output of the first amplifier; determine one or more parameters for digital pre-distortion (DPD) associated with the first amplifier based at least in part on the first signal; pre-distort a third signal based at least in part on the one or more parameters; amplify the pre-distorted third signal via the first amplifier; and transmit the amplified third signal.

Certain aspects provide an apparatus configured for wireless communications. The apparatus includes a receive path comprising a variable resistive element. The apparatus further includes one or more memories and one or more processors coupled to the one or more memories and the receive path. The one or more processors are configured to cause the apparatus to determine one or more parameters for distortion compensation based on a first signal inductively received at the receive path during a first mode; and adjust a first attenuation, applied to the inductively received first signal, via a variable resistance of the variable resistive element based on the first mode.

Certain aspects provide a method for wireless communications by an apparatus. The method includes obtaining a first signal, based on a second signal output by a first amplifier of a transmit path, via a receive path being inductively coupled to an output of the first amplifier. The method further includes determining one or more parameters for digital pre-distortion (DPD) associated with the first amplifier based at least in part on the first signal. The method further includes pre-distorting a third signal based at least in part on the one or more parameters. The method further includes amplifying the pre-distorted third signal via the first amplifier. The method further includes transmitting the amplified third signal.

Other aspects provide: an apparatus operable, configured, or otherwise adapted to perform any one or more of the aforementioned methods and/or those described elsewhere herein; a non-transitory, computer-readable medium comprising instructions that, when executed by a processor of an apparatus, cause the apparatus to perform the aforementioned methods as well as those described elsewhere herein; a computer program product embodied on a computer-readable storage medium comprising code for performing the aforementioned methods as well as those described elsewhere herein; and/or an apparatus comprising means for performing the aforementioned methods as well as those described elsewhere herein. By way of example, an apparatus may comprise a processing system, a device with a processing system, or processing systems cooperating over one or more networks.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized in other aspects without specific recitation.

DETAILED DESCRIPTION

Figure 1:
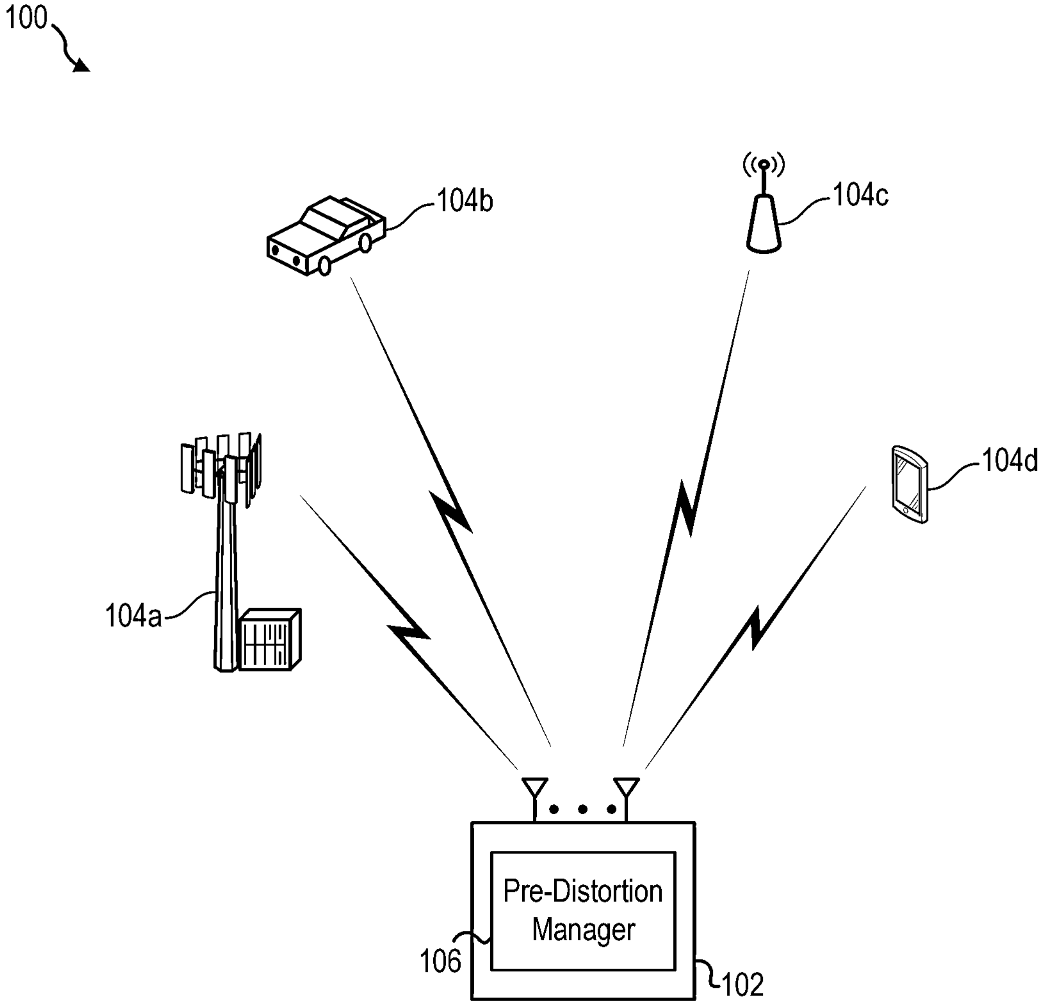
FIG. 1 illustrates an example wireless communications system.

Aspects of the present disclosure provide apparatus, methods, processing systems, and computer-readable mediums for pre-distortion training feedback via inductive coupling.

A power amplifier (PA) in a radio frequency (RF) transmitter converts a low power signal to a high power signal for transmission via an antenna. In general, the PA consumes a large amount of electrical current to perform the high power conversion in a transceiver. The non-linearity of a PA may cause gain compression, intermodulation distortion, amplitude-to-phase modulation (AM-PM) conversion, amplitude-to-amplitude modulation (AM-AM) conversion, spectral regrowth, etc. These non-linear effects can lead to adjacent channel interference, in-band distortion, block error rate degradation, and/or non-compliance with certain regulations on RF emissions (e.g., permissible out-of-band RF emissions).

Pre-distortion is a technique used to compensate for non-linear effects of an amplifier, such as a PA. Pre-distortion (e.g., phase and/or amplitude corrections) can be applied to an input signal to the PA in order to cancel or compensate for the non-linear effects and improve the linearity of the output of the PA. Linearizing the PA output via pre-distortion can enable efficiencies in terms of power consumption and/or reducing chip heat. Digital pre-distortion (DPD) is the process of applying a pre-distortion in a digital domain, such as pre-distorting a digital baseband signal. DPD provides a cost effective method of applying the pre-distortion to a communications signal. Accordingly, pre-distortion can enable certain power efficiencies by allowing a PA to be operated in a non-linear region of the PA gain response (e.g., at gain compression or saturation point). The non-linear region may refer to when the PA is operating at a level of amplification where the PA is amplifying a signal non-linearly.

Technical problems for pre-distortion include, for example, capturing suitable feedback to characterize the non-linearity of the PA for pre-distortion training. During pre-distortion training (e.g., at a device calibration phase and/or online training phase), the non-linear effects of a PA are characterized by feeding a training signal to the PA as input and comparing the corresponding output signal of the PA to the training signal. The non-linearity of the PA may introduce certain gain and/or phase errors into the training signal as indicated in the output signal. Pre-distortion aims to compensate for the non-linear effects of the PA by altering the input signal fed to the PA such that the non-linear distortions of the PA are effectively canceled from the output signal of the PA.

As there is an ongoing desire to reduce the size of RF transceiver components (for example, for cost and power savings), obtaining the output signal of the PA for pre-distortion training without other distortions and/or interference from the input training signal can pose certain challenges. Certain pre-distortion training feedback architectures may selectively couple a receive path of a transceiver to the output of the PA on a transmit path of the transceiver, via a signal trace, to provide a pre-distortion feedback path that can feed the output of the PA to a digital signal processor (DSP). For example, the pre-distortion feedback path may include a switch, an attenuation capacitor, transimpedance amplifier, a separate feedback mixer, and/or a separate baseband amplifier/filter coupled to the signal trace between the receive path and the output of the PA on the transmit path. Accordingly, in some cases, the training signal can constructively or destructively interfere with the PA feedback signal, for example, due to the receive path sharing the same supply and ground as the transmit path or isolation specifications between components. In addition, the feedback mixer and/or transimpedance amplifier may contribute to the power consumption and space of the circuitry used for pre-distortion training. The transimpedance amplifier may also have non-linear effects on the feedback signal, which may affect the signal quality of the feedback signal in characterizing the non-linearity of the PA. The attenuation capacitor may allow noise or interference to pass through the common ground between the transmit path and the receive path, which may affect the signal quality of the feedback signal.

Aspects described herein may overcome the aforementioned technical problem(s), for example, by providing pre-distortion training feedback via inductive coupling. To characterize the non-linear effects of an amplifier for pre-distortion training, an output of the amplifier may be inductively coupled to a receive path of a transceiver. As an example, a transmit path of a transceiver may include a first inductive element coupled to the output of the amplifier, and a receive path of the transceiver path may include second inductive element that is arranged to be inductively coupled with the first inductive element. In certain aspects, the first inductive element may include a transformer, which may also serve to provide impedance matching between the transmit path and antenna. In certain aspects, a resistor bank may be coupled to the second inductive element to selectively attenuate the signal obtained via the inductive coupling between the output of the amplifier and the receive path. The resistor bank may apply the attenuation in order to reduce the non-linear effects of the receive path on the PA feedback signal.

Certain techniques for pre-distortion training via inductive coupling described herein may provide various beneficial technical effects and/or advantages. The inductive coupling for pre-distortion training described herein may enable reduced power consumption and/or circuit space used for pre-distortion training circuitry. As an example, as the pre-distortion feedback path is implemented via inductive coupling, the pre-distortion feedback path can eliminate certain non-linear, active circuitry, such as the transimpedance amplifier discussed above, that would otherwise contribute to the power consumption, space, and/or auxiliary non-linear effects used for pre-distortion training. The inductive coupling for pre-distortion training described herein can eliminate an attenuation capacitor in the pre-distortion feedback path, and thus, the inductive coupling can suppress or avoid certain interference or noise allowed to pass through a common ground node. The inductive coupling for pre-distortion training described herein may enable effective isolation from interference and/or noise between the transmit path and receive path during pre-distortion training, and in turn, improved signal quality of the feedback signal for characterization of the PA non-linearity. The improved signal quality of the feedback signal via the inductive coupling described herein may enable improved pre-distortion (e.g., cancellation of the PA non-linearity) and PA performance, such as reduced error vector magnitude (EVM) and/or improved PA efficiencies (e.g., operating temperature, power consumption, and/or gain compression).

Example Wireless Communications System

FIG. 1 illustrates an example wireless communications system 100 in which aspects of the present disclosure may be performed. For example, the wireless communications system 100 may include a wireless wide area network (WWAN), a wireless local area network (WLAN), and/or a satellite network. For example, a WWAN may include a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation (2G) or Third Generation (3G) network), a code division multiple access (CDMA) system (e.g., a 2G/3G network), any future WWAN system, or any combination thereof. A WLAN may include a wireless network configured for communications according to an Institute of Electrical and Electronics Engineers (IEEE) standard such as one or more of the 802.11 standards, etc. In some cases, the wireless communications system 100 may include a device-to-device (D2D) communications network or a short-range communications system, such as Bluetooth or near field communications (NFC).

As illustrated in FIG. 1, the wireless communications system 100 may include a first wireless device 102 communicating with any of various second wireless devices 104*a-d* (hereinafter "the second wireless device 104") via any of various radio access technologies (RATs), where a wireless device may refer to a wireless communications device. The RATs may include, for example, WWAN communications (e.g., E-UTRA and/or 5G NR), WLAN communications (e.g., IEEE 802.11), vehicle-to-everything (V2X) communications, non-terrestrial network (NTN) communications, short-range communications (e.g., Bluetooth), etc.

The first wireless device 102 may include any of various wireless communications devices including a user equipment (UE), a base station, a wireless station, an access point, customer-premises equipment (CPE), etc. In certain aspects, the first wireless device 102 includes a pre-distortion manager 106 that controls pre-distortion training or calibration via inductive coupling, in accordance with aspects of the present disclosure.

The second wireless device 104 may include, for example, a base station 104*a*, a vehicle 104*b*, an access point (AP) 104*c*, and/or a UE 104*d*. Further, the wireless communications systems 100 may include terrestrial aspects, such as ground-based network entities (e.g., the base station 104*a* and/or access point 104*c*), and/or non-terrestrial aspects, such as a spaceborne platform and/or an aerial platform, which may include network entities on-board (e.g., one or more base stations) capable of communicating with other network elements (e.g., terrestrial base stations) and/or user equipment.

The base station 104*a* may generally include: a NodeB, enhanced NodeB (eNB), next generation enhanced NodeB (ng-eNB), next generation NodeB (gNB or gNodeB), access point, base transceiver station, radio base station, radio transceiver, transceiver function, transmission reception point, and/or others. The base station 104*a* may provide communications coverage for a respective geographic coverage area, which may sometimes be referred to as a cell, and which may overlap in some cases (e.g., a small cell may have a coverage area that overlaps the coverage area of a macro cell). A base station may, for example, provide communications coverage for a macro cell (covering relatively large geographic area), a pico cell (covering relatively smaller geographic area, such as a sports stadium), a femto cell (relatively smaller geographic area (e.g., a home)), and/or other types of cells.

The first wireless device 102 and/or the UE 104*d* may generally include: a cellular phone, smart phone, session initiation protocol (SIP) phone, laptop, personal digital assistant (PDA), satellite radio, global positioning system, multimedia device, video device, digital audio player, camera, game console, tablet, smart device, wearable device, vehicle, electric meter, gas pump, large or small kitchen appliance, healthcare device, implant, sensor/actuator, display, internet of things (IoT) devices, always on (AON) devices, edge processing devices, or other similar devices. A UE may also be referred to more generally as a mobile device, a wireless device, a wireless communications device, a wireless station (STA), a mobile station, a subscriber station, a mobile subscriber station, a mobile unit, a subscriber unit, a wireless unit, a remote unit, a remote device, an access terminal, a mobile terminal, a wireless terminal, a remote terminal, a handset, and other terms.

Figure 2:
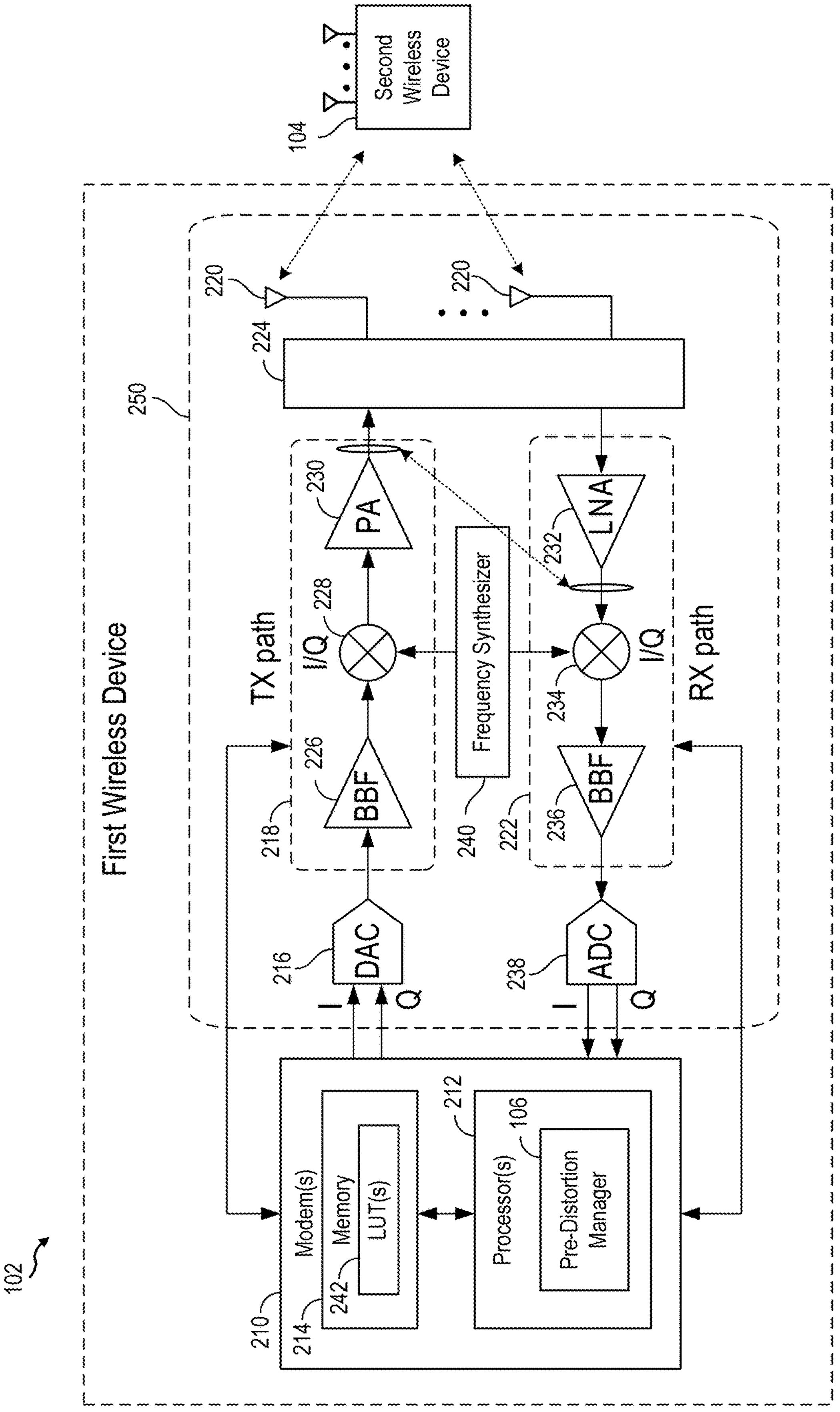
FIG. 2 illustrates an example wireless communication device communicating with another device.

FIG. 2 illustrates example components of the first wireless device 102, which may be used to communicate with any of the second wireless devices 104.

The first wireless device 102 may be, or may include, a chip, system on chip (SoC), system in package (SiP), chipset, package, device that includes one or more modems 210 (hereinafter "the modem 210"). In some cases, the modem 210 may include, for example, any of a WWAN modem (e.g., a modem configured to communicate via E-UTRA 5G NR, and/or any future WWAN communications standards), a WLAN modem (e.g., a modem configured to communicate via IEEE 802.11 standards), a Bluetooth modem, a NTN modem, etc. In certain aspects, the first wireless device 102 also includes one or more RF transceivers (hereinafter "the RF transceiver 250"). In some cases, the RF transceiver 250 may be referred to as an RF front end (RFFE). In some aspects, the modem 210 further includes one or more processors, processing blocks or processing elements (hereinafter "the processor 212") and one or more memory blocks or elements (hereinafter "the memory 214"). In some cases, the processor 212 may implement and/or include the pre-distortion manager 106. In other configurations, the processor 212 and/or the memory 214 are implemented external or otherwise separate from the modem 210.

In certain aspects, the processor 212 may process any of certain protocol stack layers associated with a radio access technology (RAT). For example, the processor 212 may process any of an application layer, packet layer, WLAN protocol stack layers (e.g., a link or a medium access control (MAC) layer), and/or WWAN protocol stack layers (e.g., a radio resource control (RRC) layer, a packet data convergence protocol (PDCP) layer, a radio link control (RLC) layer, and a MAC layer).

The modem 210 may generally be configured to implement a physical (PHY) layer. For example, the modem 210 may be configured to modulate packets and to output the modulated packets to the RF transceiver 250 for transmission over a wireless medium. The modem 210 is similarly configured to obtain modulated packets received by the RF transceiver 250 and to demodulate the packets to provide demodulated packets. In addition to a modulator and a demodulator, the modem 210 may further include digital signal processing (DSP) circuitry, automatic gain control (AGC), a coder, a decoder, a multiplexer, and/or a demultiplexer (not shown).

As an example, while in a transmission mode, the modem 210 may obtain data from a data source, such as an application processor. The data may be provided to a coder, which encodes the data to provide encoded bits. The encoded bits may be mapped to points in a modulation constellation (e.g., using a selected modulation and coding scheme) to provide modulated symbols. The modulated symbols may be mapped, for example, to spatial stream(s) or space-time streams. The modulated symbols may be multiplexed, transformed via an inverse fast Fourier transform (IFFT) block, and subsequently provided to DSP circuitry for transmit windowing and filtering. The digital signals may be provided to a digital-to-analog converter (DAC) 216. In certain aspects involving beamforming, the modulated symbols in the respective spatial streams may be precoded via a steering matrix prior to provision to the IFFT block.

The modem 210 may be coupled to the RF transceiver 250 by a transmit (TX) path 218 (also known as a transmit chain) for transmitting signals via one or more antennas 220 (hereinafter "the antenna 220") and a receive (RX) path 222 (also known as a receive chain) for receiving signals via the antenna 220. When the TX path 218 and the RX path 222 share the antenna 220, the paths may be coupled to the antenna 220 via an interface 224, which may include any of various suitable RF devices, such as an antenna tuner, a switch, a duplexer, a diplexer, a multiplexer, and the like. As an example, the modem 210 may output digital in-phase (I) and/or quadrature (Q) baseband signals representative of the respective symbols to the DAC 216. In some examples, all or a subset of the elements illustrated as being included in the RF transceiver 250 are implemented in a single chip or die. For example, in some configurations, all of the elements of the RF transceiver except the antenna 220 are implemented on a single chip. In some other configurations, the interface 224 or a portion thereof is also omitted from the single chip.

Receiving I or Q baseband analog signals from the DAC 216, the TX path 218 may include a baseband filter (BBF) 226, a mixer 228 (which may include one or several mixers), and a power amplifier (PA) 230. The BBF 226 filters the baseband signals received from the DAC 216, and the mixer 227 mixes the filtered baseband signals with a transmit local oscillator (LO) signal to convert the baseband signal to a different frequency (e.g., upconvert from a baseband frequency to a radio frequency). In some aspects, the frequency conversion process produces the sum and difference frequencies between the LO frequency and the frequencies of the baseband signal. The sum and difference frequencies are referred to as the beat frequencies. Some beat frequencies are in the RF range, such that the signals output by the mixer 228 are typically RF signals, which may be amplified by the PA 230 before transmission by the antenna 220. The antennas 220 may emit RF signals, which may be received at the second wireless device 104. While one mixer 228 is illustrated, several mixers may be used to upconvert the filtered baseband signals to one or more intermediate frequencies and to thereafter upconvert the intermediate frequency signals to a frequency for transmission.

The RX path 222 may include a low noise amplifier (LNA) 232, a mixer 234 (which may include one or several mixers), and a baseband filter (BBF) 236. RF signals received via the antenna 220 (e.g., from the second wireless device 104) may be amplified by the LNA 232, and the mixer 234 mixes the amplified RF signals with a receive local oscillator (LO) signal to convert the RF signal to a baseband frequency (e.g., downconvert the RF signal to the baseband frequency). The baseband signals output by the mixer 234 may be filtered by the BBF 236 before being converted by an analog-to-digital converter (ADC) 238 to digital I or Q signals for digital signal processing. The modem 210 may receive the digital I or Q signals and further process the digital signals, for example, demodulating the digital signals into information.

Certain transceivers may employ frequency synthesizers with a voltage-controlled oscillator (VCO) to generate a stable, tunable LO frequency with a particular tuning range. Thus, the transmit LO frequency may be produced by a frequency synthesizer 240, which may be buffered or amplified by an amplifier (not shown) before being mixed with the baseband signals in the mixer 228. Similarly, the receive LO frequency may be produced by the frequency synthesizer 240, which may be buffered or amplified by an amplifier (not shown) before being mixed with the RF signals in the mixer 234. Separate frequency synthesizers may be used for the TX path 218 and the RX path 222.

While in a reception mode, the modem 210 may obtain digitally converted signals via the ADC 238 and RX path 222. As an example, in the modem 210, digital signals may be provided to the DSP circuitry, which is configured to acquire a received signal, for example, by detecting the presence of the signal and estimating the initial timing and frequency offsets. The DSP circuitry is further configured to digitally condition the digital signals, for example, using channel (narrowband) filtering, analog impairment conditioning (such as correcting for I/Q imbalance), and applying digital gain to ultimately obtain a narrowband signal. The output of the DSP circuitry may be fed to the AGC, which is configured to use information extracted from the digital signals, for example, in one or more received training fields, to determine an appropriate gain. The output of the DSP circuitry also may be coupled with the demodulator, which is configured to extract modulated symbols from the signal and, for example, compute the logarithm likelihood ratios (LLRs) for each bit position of each subcarrier in each spatial stream. The demodulator may be coupled with the decoder, which may be configured to process the LLRs to provide decoded bits. The decoded bits from all of the spatial streams may be fed to the demultiplexer for demultiplexing. The demultiplexed bits may be descrambled and provided to a medium access control layer (e.g., the processor 212) for processing, evaluation, or interpretation.

Figure 3A:
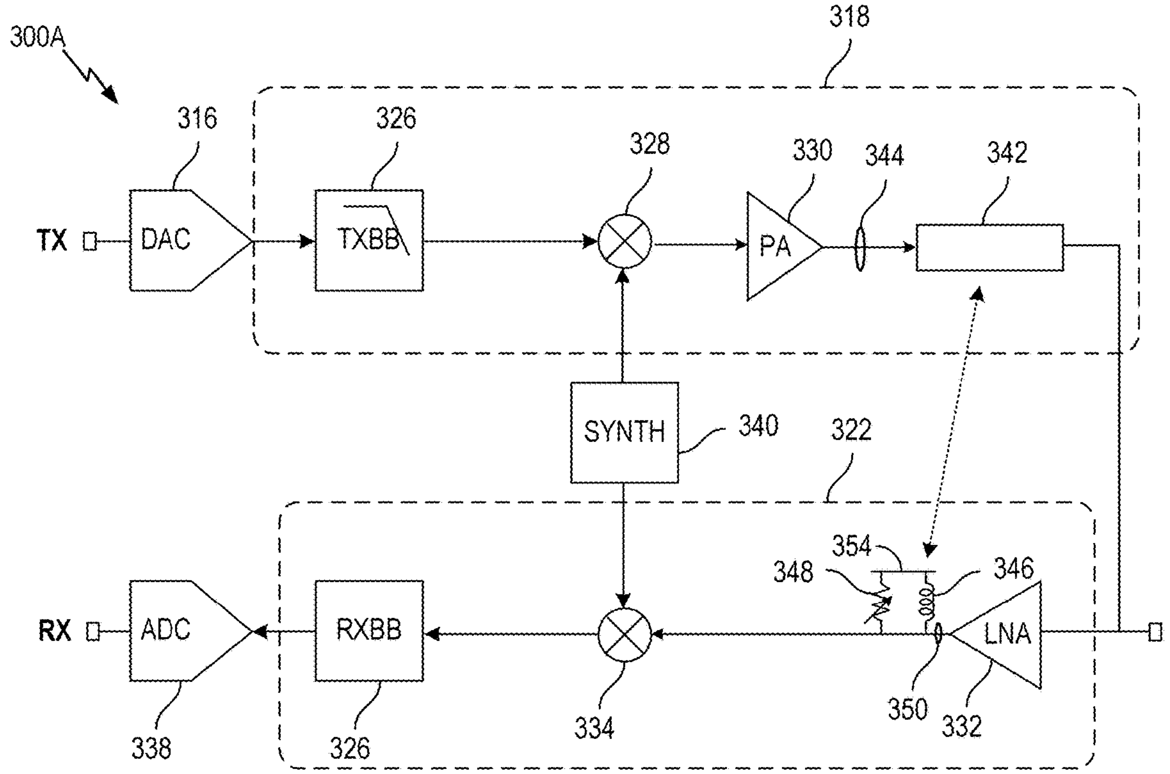
FIGS. 3A and 3B illustrate example transceiver architectures that employ inductive coupling between a receive path and a transmit path for pre-distortion training.
Figure 3B:
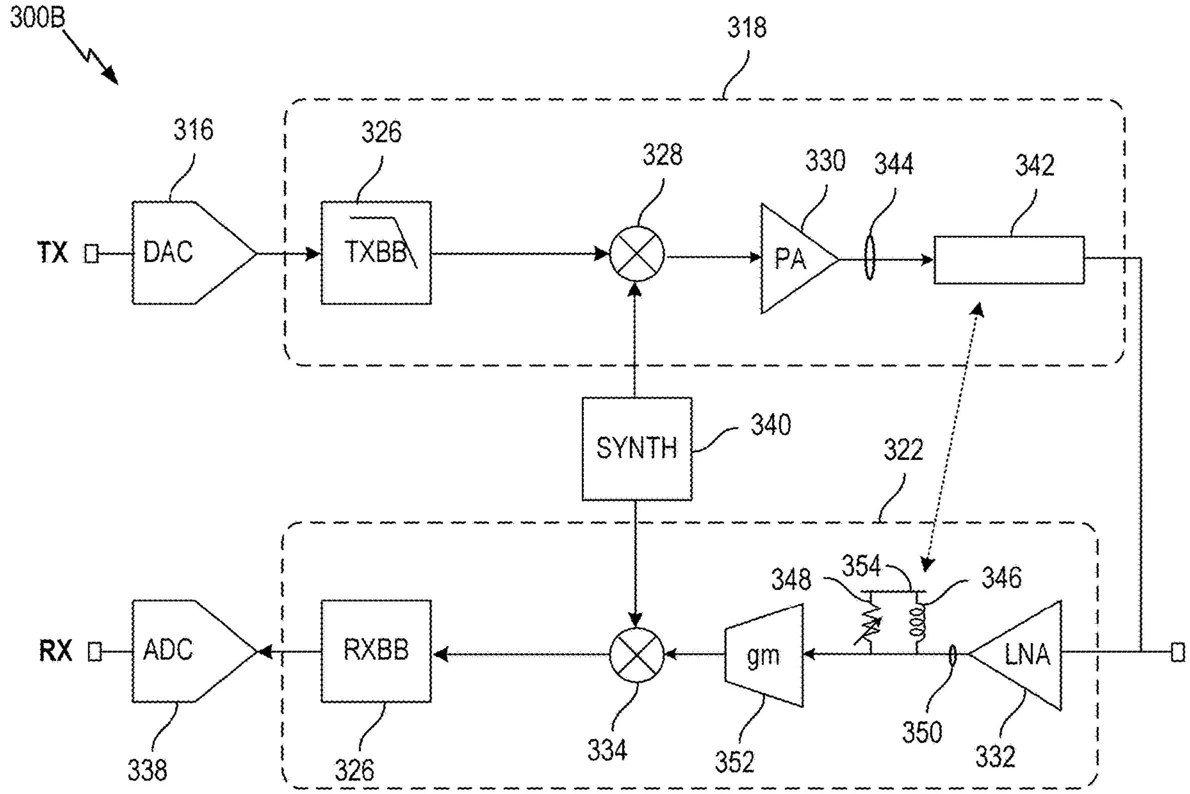
Figure 4:
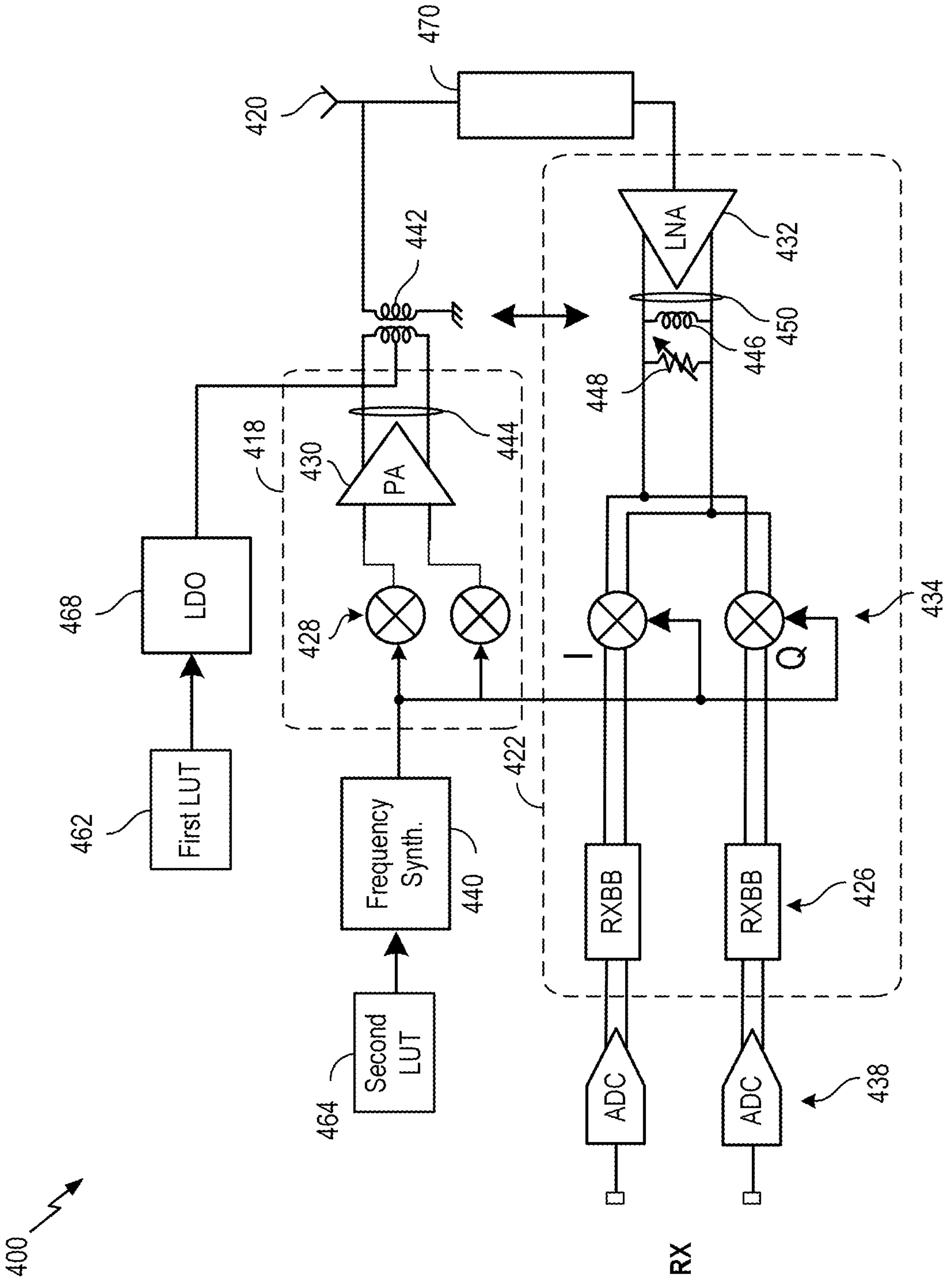
FIG. 4 illustrates an example architecture for training and applying pre-distortion in a transceiver.

As further described herein with respect to FIGS. 3A, 3B, and 4, the output of the PA 230 may be inductively coupled to the RX path 222 in order to enable sampling of the PA output for pre-distortion training. The processor 212 (e.g., using the pre-distortion manager 106) may perform certain aspects of the pre-distortion training to set certain values of one or more look-up tables (LUTs) 242 indicative of pre-distortion model coefficients, as further described herein. In certain aspects, the LUTs 242 may include AM-PM conversion parameters for the pre-distortion. As an example, during pre-distortion training, a training signal may be fed as input to the PA 230, which outputs an amplified signal. A pre-distortion feedback signal, based on the amplified output signal of the PA 230, is induced on the RX path through inductive coupling, as further described herein with respect to FIGS. 3A and 3B. The pre-distortion feedback signal may be indicative of the non-linearity of the PA and digitally sampled via the ADC 238.

In a digital domain (for example), the processor 212 (e.g., using the pre-distortion manager 106) may compare the pre-distortion feedback signal to the training signal to characterize the non-linearity of the PA 230 and determine pre-distortion coefficients for distortion compensation, such as digital pre-distortion (DPD). The processor 212 may determine pre-distortion coefficients of an inverse model of the PA 230 that can be used to effectively cancel certain non-linear effects of the PA 230 via pre-distortion. The processor 212 may pre-calculate the inverse model across a range of possible inputs and store the results in the LUT(s) 242. The LUT(s) 242 may provide certain operating parameter(s) for one or more components of the TX path 218 to perform phase and/or amplitude corrections for the pre-distortion. As an example, during transmission mode, the modem 210 and/or processor 212 may apply the DPD to a transmit signal in the digital domain and feed the pre-distorted transmit signal to the TX path 218 via the DAC 216. The DPD may effectively cancel (or compensate for) the non-linear effects of the PA 230.

The modem 210 and/or processor 212 may control the transmission of signals via the TX path 218 and/or reception of signals via the RX path 222. In some aspects, the modem 210 and/or processor 212 may be configured to perform various operations, such as those associated with any of the methods described herein. The modem 210 and/or processor 212 may include a microcontroller, a microprocessor, an application processor, a baseband processor, a MAC processor, an artificial intelligence (AI) processor, a digital signal processor (DSP), an application specific integrated circuit (ASIC), a field programmable gate array (FPGA) or other programmable logic device (PLD), discrete gate or transistor logic, discrete hardware components, or any combination thereof. The memory 214 may store data and program codes (e.g., processor-readable instructions) for performing wireless communications as described herein. In some cases, the memory 214 may be external to the modem 210 and/or processor 212 and/or incorporated therein (as illustrated or with the memory 214 being incorporated with the processor 212).

FIG. 2 shows an example transceiver design. It will be appreciated that other transceiver designs or architectures may be applied in connection with aspects of the present disclosure. For example, while examples discussed herein utilize I and Q signals (e.g., quadrature modulation), those of skill in the art will understand that components of the transceiver may be configured to utilize any other suitable modulation, such as polar modulation. As another example, circuit blocks may be arranged differently from the configuration shown in FIG. 2, and/or other circuit blocks not shown in FIG. 2 may be implemented in addition to or instead of the blocks depicted.

Example Pre-Distortion Training Via Inductive Coupling

Aspects of the present disclosure provide techniques for pre-distortion training via inductive coupling. The inductive coupling may enable reduced power consumption and/or circuit space for pre-distortion training circuitry.

FIGS. 3A and 3B illustrate example transceiver architectures 300A, 300B that employ inductive coupling between a receive path 322 and a transmit path 318 for pre-distortion training. The architectures 300A and 300B are examples of architectures that may be implemented by the RF transceiver 250. Referring to FIG. 3A, the first transceiver architecture 300A includes a DAC 316 that feeds an analog baseband signal to the transmit path 318, as described herein with respect to FIG. 2. The DAC 316 and the transmit path 318 may be examples of the DAC 216 and TX path 218 of FIG. 2, respectively. The transmit path 318 includes a BBF 326, a mixer 328, and a PA 330, which may also be examples of the corresponding components of the TX path 218. The transmit path 318 further includes a first inductive element 342 that may enable the inductive coupling between the output of the PA 330 and the receive path 322. In certain aspects, the first inductive element 342 may be or include an inductor and/or a transformer used for impedance matching between the transmit path 318 and an antenna (not shown), such as the antenna 220. The PA 330 has an output 344 coupled to the first inductive element 342. In certain aspects, the PA 330 may be or include a multi-stage PA comprising a cascade of at least a first stage PA and a second stage PA, where the first stage PA feeds or drives the second stage PA. The pre-distortion training described herein may be applied to any of the PAs in a multi-stage PA.

The first architecture 300A also includes a receive path 322 that feeds an analog baseband signal to an ADC 338, as described herein with respect to FIG. 2. With respect to FIG. 3, the receive path 322 and the ADC 338 may be examples of the RX path 222 and the ADC 238 of FIG. 2, respectively. The receive path 322 includes an LNA 332, a mixer 334, and a BBF 326, which may be examples of the corresponding components of the RX path 222. In this example, the mixer 334 may include a voltage mode mixer. A frequency synthesizer 340 may feed the mixers 334, 328 as described herein with respect to FIG. 2. The receive path 322 also includes a second inductive element 346, and in certain cases, the receive path 322 may include a variable resistive element 348 coupled to the second inductive element 346. In certain aspects, the second inductive element 346 and the variable resistive element 348 may be coupled to a reference node 354 (e.g., a supply voltage or a reference potential). The second inductive element 346 may be or include an inductor coupled (e.g., directly connected) to an output 350 of the LNA 332. The first inductive element 342 may be arranged to be inductively coupled to the second inductive element 346. As an example, the first inductive element 342 may be arranged in a circuit package to be positioned in a first layer above the second inductive element 346 in a second layer (not shown).

Figure 5:
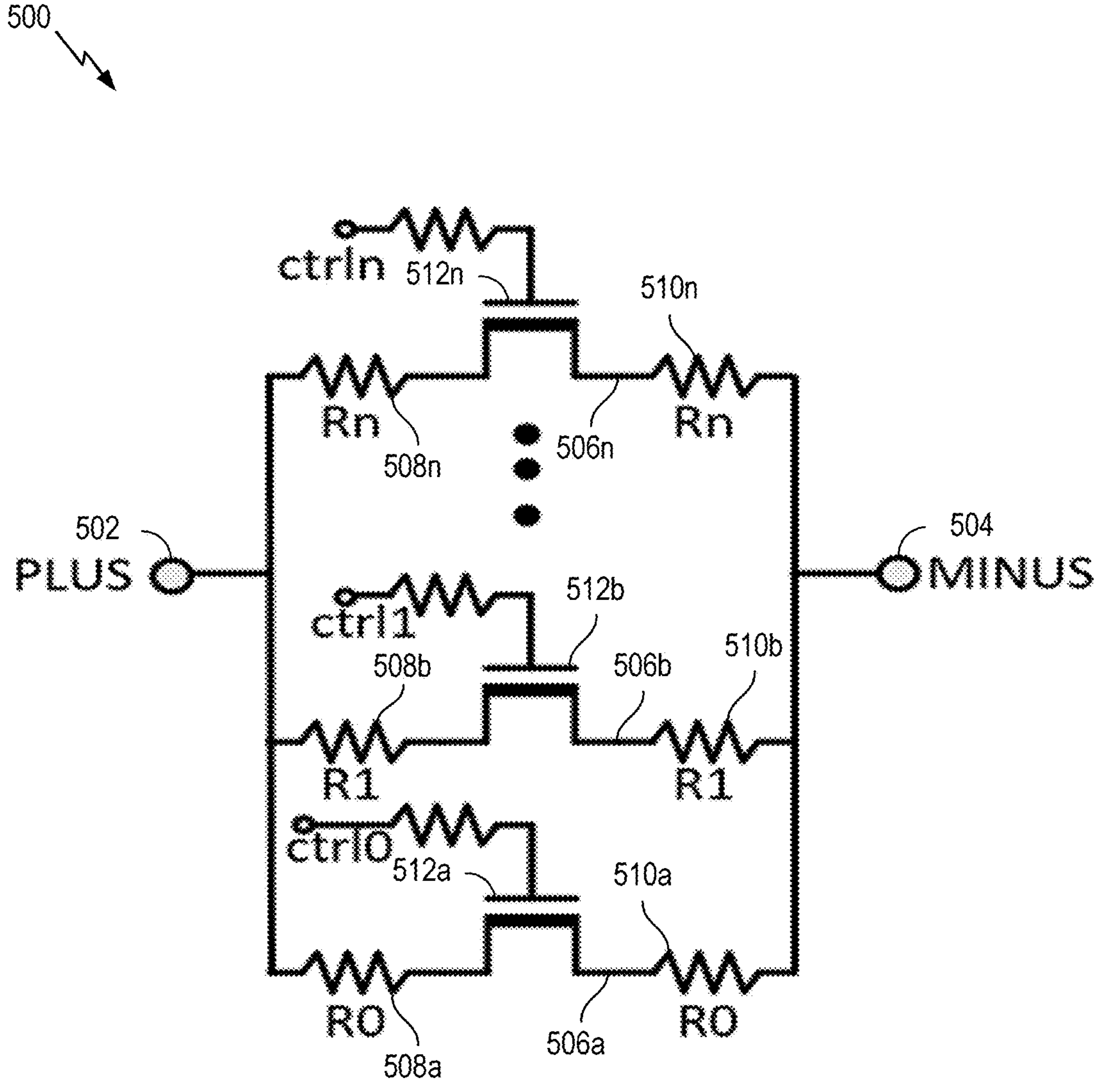
FIG. 5 illustrates an example resistor bank that may be employed in a receive path of a transceiver.

The variable resistive element 348 may be or include a resistor bank having a variable resistance across a range of resistance values, for example, as further described herein with respect to FIG. 5. The variable resistive element 348 may be coupled in parallel with the second inductive element 346, for example such that the variable resistive element 348 is also coupled (e.g., directly connected or coupled) to an output 350 of the LNA 332. In certain aspects, the resistance of the variable resistive element 348 may be selected to adjust the mutual inductance between the first inductive element 342 and the second inductive element 346, for example, due to the resistive load of the variable resistive element 348 affecting the current that flows through the second inductive element 346. As an example, a lower resistance of the variable resistive element 348 may cause a reduction in the mutual inductance between the first inductive element 342 and the second inductive element 346, for example, due to less current being allowed to flow through the second inductive element 346. A higher resistance (relative to the lower resistance) of the variable resistive element 348 may cause an increase in the mutual inductance between the first inductive element 342 and the second inductive element 346, for example, due to more current being allowed to flow through the second inductive element 346. In certain aspects, the resistance of the variable resistive element 348 may be selected to adjust the quality factor of the second inductive element 346. In certain aspects, the resistance of the variable resistive element 348 may be selected to attenuate the pre-distortion feedback signal and suppress certain non-linear effects of the receive path 322, such as the non-linearity of the mixer 334.

In certain aspects, the processor 212 of FIG. 2 may adjust an attenuation applied to a signal carried through the receive path 322 depending on an operating mode of the transceiver, such as a training mode or a communications mode. The processor 212 may adjust a first attenuation, applied to a first signal inductively received at the receive path 322, via the variable resistance of the variable resistive element 348 based on a first mode (e.g., a training or calibration mode). The processor 212 may adjust a second attenuation, applied to a second signal obtained via the receive path 322 (for example, via an antenna), via the variable resistance of the variable resistive element 348 based on a second mode (e.g., a communications mode).

During pre-distortion training (e.g., the training or calibration mode), the DAC 316 may output a specific training signal (e.g., based on an input from the modem 210 and/or predistortion manager 106) used to characterize the distortion or non-linearity of an amplifier, such as the PA 330. In this example, the PA 330 feeds an output signal to the first inductive element 342, which is inductively coupled to the second inductive element 346. As the output signal is being fed into the first inductive element 342, the inductive coupling between the first inductive element 342 and the second inductive element 346 allows a pre-distortion feedback signal to be induced in the second inductive element 346. In certain aspects, the variable resistive element 348 may be configured to adjust an attenuation applied to the pre-distortion feedback signal obtained via the inductive coupling between the first inductive element 342 and the second inductive element 346. The attenuation applied to the pre-distortion feedback signal may be selected to suppress certain non-linear effects of the receive path 322, such as the non-linearity of the mixer 334. The variable resistive element 348 may be configured to adjust the mutual inductance between the first inductive element 342 and the second inductive element 346.

In certain aspects, one or more other components (e.g., the mixer 328 and/or frequency synthesizer 340) may be used in addition to or instead of the DAC 316 to output a training signal (e.g., based on an input from the modem 210 and/or predistortion manager 106). As an example, the training signal may be derived via a local oscillator and/or frequency synthesizer without the DAC 316.

The pre-distortion feedback signal is fed to the ADC 338, which enables digital signal processing on the pre-distortion feedback signal to characterize the distortion associated with the PA 330. As an example, the processor 212 (e.g., using the predistortion manager 106) of FIG. 2 may determine one or more parameters for distortion compensation (e.g., DPD) associated with the PA 330 based at least in part on the pre-distortion feedback signal, which may be inductively received at the receive path 322 during a first mode (e.g., a training mode). The processor 212 may compare the pre-distortion feedback signal, which is based on the output signal of the PA 330, to the training signal used as input for the PA 330. In certain aspects, the parameter(s) may be or include a gain error and/or phase error associated with the pre-distortion feedback signal relative to the training signal. The parameter(s) may be or include pre-distortion coefficients (e.g., memory-polynomial coefficients of a generalized polynomial model for DPD), an amplitude-to-phase modulation (AM-PM) conversion associated with the PA 330, and/or an amplitude-to-amplitude modulation (AM-AM) conversion associated with the PA 330.

Referring to FIG. 3B, the first architecture 300A may be representative of certain aspects of the second architecture 300B. In general, the second architecture 300B may be the same as the first architecture 300A, except that in the second architecture 300B, the mixer 334 of the receive path 322 may be or include a current mode mixer. Accordingly, as depicted in FIG. 3B, the receive path 322 includes a transconductance amplifier 352 coupled between the mixer 334 and the variable resistive element 348. The transconductance amplifier 352 is configured to convert an input voltage to an output current. In some cases, the transconductance amplifier 352 may referred to as a current mode transimpedance amplifier.

In some examples, no physical connection or trace is implemented that connects a node in the signal path between the PA 330 and the inductive element 342 to the receive path 322 or any other receive signal path. While the TX path 318 and the receive path 322 may be coupled to common baseband circuitry (e.g., the modem 210) and/or to common synthesizer circuity (e.g., 340), no other physical connections or paths may be implemented between the signal path in the transmit path 318 and the signal path in the receive path 322 in some examples. In certain aspects, the output of the PA 330 may be electrically coupled to the receive path 322 without a physical electrical connection (such as a signal trace, via, wire, and/or the like) coupled between the PA 330 and the receive path 322. The output of the PA 330 may be electrically coupled to the receive path 322 via the inductive coupling without the physical connection or without being physically coupled to the receive path 322. In certain aspects, the output of the PA 330 may not be physically coupled to the receive path 322.

FIG. 4 illustrates an example architecture 400 for training and applying pre-distortion in a transceiver, such as the RF transceiver 250 of FIG. 2. In this example, the architecture 400 includes in-phase and quadrature components, such as mixers 428, mixers 434, BBFs 426, and ADCs 438. The architecture 400 also includes differential-mode components, such as the mixers 428, PA 430, LNA 432, mixers 434, BBFs 426, and ADC 438. The architecture 400 includes an impedance matching circuit 470 configured to match the impedance between the antenna 420 and the transmit path 418 (a portion of which is depicted) and/or the receive path 422. The first architecture 300A may be representative of the architecture 400 where the output 444 of the PA 430 is inductively coupled to the receive path 422 via the first inductive element 442 and the second inductive element 446. In this example, due to the differential-mode architectures, the first inductive element 442 is coupled between the differential output 444 of the PA 430, and the second inductive element 446 is coupled between the differential output 450 of the LNA 432. The variable resistive element 448 may also be coupled between the differential output 450 of the LNA 432. Also in this example, the first inductive element 442 is implemented as a transformer, for example as a balun, which may convert a balanced (differential) signal to a single-ended (common mode) signal, as shown in FIG. 4. In certain cases, the first inductive element 442 may be implemented as a transformer that does not convert between single ended and differential signals.

The architecture 400 includes one or more look-up tables (LUTs) 462, 464 (e.g., the LUT(s) 242), which may include AM-PM conversion parameters and/or AM-AM conversion parameters for the pre-distortion. As discussed herein, the processor 212 of FIG. 2 may pre-calculate an inverse model of the PA 430 across a range of possible inputs and store the results in the LUT(s) 462, 464. The LUT(s) 462, 464 may provide certain operating parameter(s) for the frequency synthesizer 440 and/or a voltage regulator 468 (e.g., a low-drop regulator (LDO)), which may be controlled via a DAC (not shown). The LUT-based operation of the frequency synthesizer 440 (e.g., via the first LUT 462) may enable phase corrections for the pre-distortion through upconversion, and the LUT-based operation of the voltage regulator 468 (e.g., via the second LUT 464) may enable amplitude corrections for the pre-distortion. The voltage regulator 468 may be coupled to a center tap of the first inductive element 442 to feed a biasing voltage to the first inductive element 442 and enable amplitude corrections for the distortion compensation. In certain aspects, the model used as the inverse model of the PA may be or include a Volterra series model, a memory polynomial (MP) model, and/or a generalized memory polynomial (GMP) model. Accordingly, the LUT(s) 462, 464 may store operating parameter(s) for the frequency synthesizer 440 and/or the voltage regulator 468 to apply certain distortion compensation(s) across certain analog circuitry of the TX path 418, such as the mixer(s) 428 and the first inductive element 442.

While the examples depicted in FIGS. 3A-4 are described herein with respect to inductive coupling for training pre-distortion to facilitate understanding, aspects of the present disclosure may be applied to employing inductive coupling for training analog and/or digital pre-distortion. In certain aspects, certain distortion compensation(s) described herein may be applied before a signal is fed to an amplifier (e.g., pre-amplification) and/or applied after a signal is output by the amplifier (e.g., post-amplification), such as the amplitude corrections via the center tap of the first inductive element 442.

It will be understood that the architectures illustrated in in FIGS. 3A-4 are examples only and that components are omitted from the drawings for simplicity. For example, the transmit path 318, 418 and the receive path 322, 422 may be coupled to different antennas instead of to the same antenna (e.g., 420) and/or the impedance matching circuit 470. Further, the signal path coupling the modem 210 to the mixer 428 (e.g., through the DAC 216, 316 and BBF 226, 326) is implemented, but not illustrated.

FIG. 5 illustrates an example resistor bank 500 that may be employed in a receive path of a transceiver. The resistor bank 500 may be an example of the variable resistive element 348, 448 of FIGS. 3A, 3B, and 4. The resistor bank 500 may include a first node 502, a second node 504, and a plurality of branches 506*a-n* coupled between the first node 502 and the second node 504. The nodes 502, 504 may be coupled between differential outputs of the LNA 432, for example, or may be coupled between a supply or reference node and an output of the LNA 332, as another example. The plurality of branches 506*a-n* are arranged in parallel between the first node 502 and the second node 504. In this example, each of the plurality of branches 506*a-n* includes one or more respective resistors 508*a-n*, 510*a-n* coupled in series with a respective switch 512*a-n* (e.g., a transistor). For example, the first branch 506*a* includes one or more first resistors 508*a*, 510*a* coupled in series with a first switch 512*a*, and so on for any other respective branches 506*b-n* in the resistor bank. A controller (e.g., the processor 212 of FIG. 2) may control which of the switches 512*a-n* is open or closed to select the resistance between the first node 502 and the second node 504. Accordingly, the resistor bank 500 may have a selective resistance value across a range of resistance values.

Accordingly, the inductive coupling for pre-distortion training provides various technical benefits and advantages. As an example, the inductive coupling allows for reduced power consumption and circuitry space used for pre-distortion training circuitry. The inductive coupling for pre-distortion training reduces auxiliary non-linear effects of feedback circuitry. The inductive coupling for pre-distortion training may improve the signal quality of the feedback signal, for example, due to the feedback path not depending on any active devices that may contribute to noise and/or interference.

Figure 6:
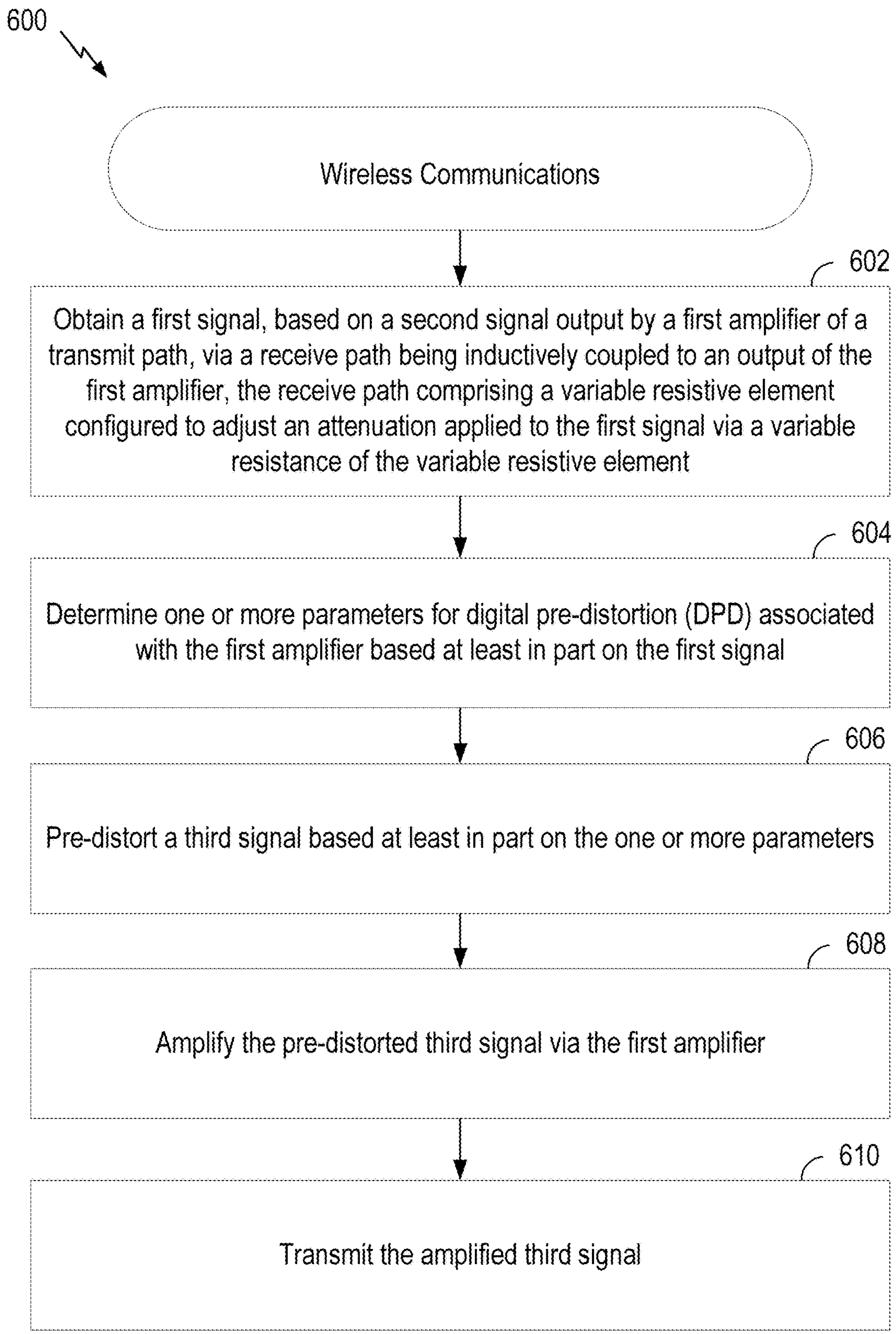
FIG. 6 illustrates example operations for wireless communications by an apparatus.

FIG. 6 illustrates example operations 600 for wireless communication. The operations 600 may be performed, for example, by a wireless device (e.g., the first wireless device 102 in the wireless communications system 100). In certain aspects, the operations 600 may be performed, for example, by a transceiver (e.g., the RF transceiver 250), a modem (e.g., the modem 210), and/or a processor (e.g., the processor 212). The operations 600 may be implemented as software components that are executed and run on one or more processors (e.g., the modem 210 and/or the processor 212 of FIG. 2). Further, the transmission and/or reception of signals by the wireless device in the operations 600 may be enabled, for example, by one or more antennas (e.g., the antenna 220 of FIG. 2). In certain aspects, the transmission and/or reception of signals by the wireless device may be implemented via a bus interface of one or more processors (e.g., the modem 210 and/or the processor 212 of FIG. 2) obtaining and/or outputting signals for reception or transmission.

The operations 600 may optionally begin, at block 602, where the wireless device may obtain a first signal (e.g., a pre-distortion feedback signal), based on a second signal output by a first amplifier (e.g., the PA 230, 330, 430) of a transmit path (e.g., the transmit path 218, 318), via a receive path (e.g., the receive path 222, 322, 422) being inductively coupled to an output of the first amplifier, the receive path comprising a variable resistive element (e.g., the variable resistive element 348, 448) configured to adjust an attenuation applied to the first signal via a variable resistance of the variable resistive element. The wireless device may include any of the inductive coupling architectures described herein with respect to FIGS. 3A, 3B, and 4. The wireless device may adjust the attenuation applied to the first signal via the variable resistive element, for example, to control the non-linear effects of the receive path on the feedback signal and/or the mutual inductance of the inductive coupling between the transmit path and the receive path as described herein. The first signal may be or include a pre-distortion feedback signal induced on the receive path via the inductive coupling between the first inductive element and the second inductive element. The second signal may be or include an output signal of the first amplifier based on a pre-distortion training signal fed to at least a portion of the transmit path including the first amplifier. In certain aspects, the receive path may be configured in a first setting for pre-distortion feedback signal sampling (e.g., in a training or calibration mode) and in a second setting for receiving communication signals via an antenna (e.g., in a communications or reception mode). For example, the resistance of the variable resistive element may be adjusted to a first value when obtaining a signal for wireless communications via an antenna coupled to the receive path and adjusted to a second value (different from the first value) when obtaining a pre-distortion feedback signal, such as the first signal.

At block 604, the wireless device may determine one or more parameters for distortion compensation (such as digital pre-distortion (DPD)) associated with the first amplifier based at least in part on the first signal. In certain aspects, the wireless device may determine the one or more parameters for the distortion compensation (e.g., the DPD) based at least in part on a comparison between the first signal and a (DPD) training signal, which may be fed as input to at least the first amplifier. In certain aspects, the one or more parameters comprises one or more of: one or more pre-distortion coefficients; an AM-PM conversion associated with the first amplifier; or an AM-AM conversion associated with the first amplifier.

At block 606, the wireless device may pre-distort a third signal (e.g., a communications signal) based at least in part on the one or more parameters. For example, the wireless device may apply the one or more parameters via a look-up table (e.g., the LUT(s) 462, 464) that configures a phase correction and/or an amplitude correction applied to the third signal as described herein with respect to FIG. 4. In certain aspects, pre-distorting a signal may include applying one or more distortion compensations to the signal, such as a phase correction and/or an amplitude correction. As an example, to pre-distort the third signal, a phase correction may be applied to the third signal, for example, via a mixer that applies a phase shift to the third signal. In certain aspects, pre-distorting the signal may include applying all or part of the distortion compensation(s) to the signal.

At block 608, the wireless device may amplify the pre-distorted third signal via the first amplifier. In certain aspects, the first amplifier may be used at or beyond a gain compression point. In certain cases, certain distortion compensation(s) may be applied to the amplified third signal. For example, an amplitude correction may be applied to the amplified third signal, for example, via a biasing voltage of a transformer, for example, as described herein with respect to FIG. 4.

At block 610, the wireless device may transmit the amplified third signal, for example, via an antenna (e.g., the antenna 220, 420). As an example, the wireless device may transmit the third signal to another wireless communication device (e.g., any of the second wireless devices 104 depicted in FIG. 1). The third signal may indicate (or carry) any of various information, such as data and/or control information. In some cases, the signal may indicate (or carry) one or more packets or data blocks.

Aspects of the present disclosure may be applied to any of various wireless communication devices that perform pre-distortion, such as a UE, wireless station, base station, access point, etc.

Example Communications Device

Figure 7:
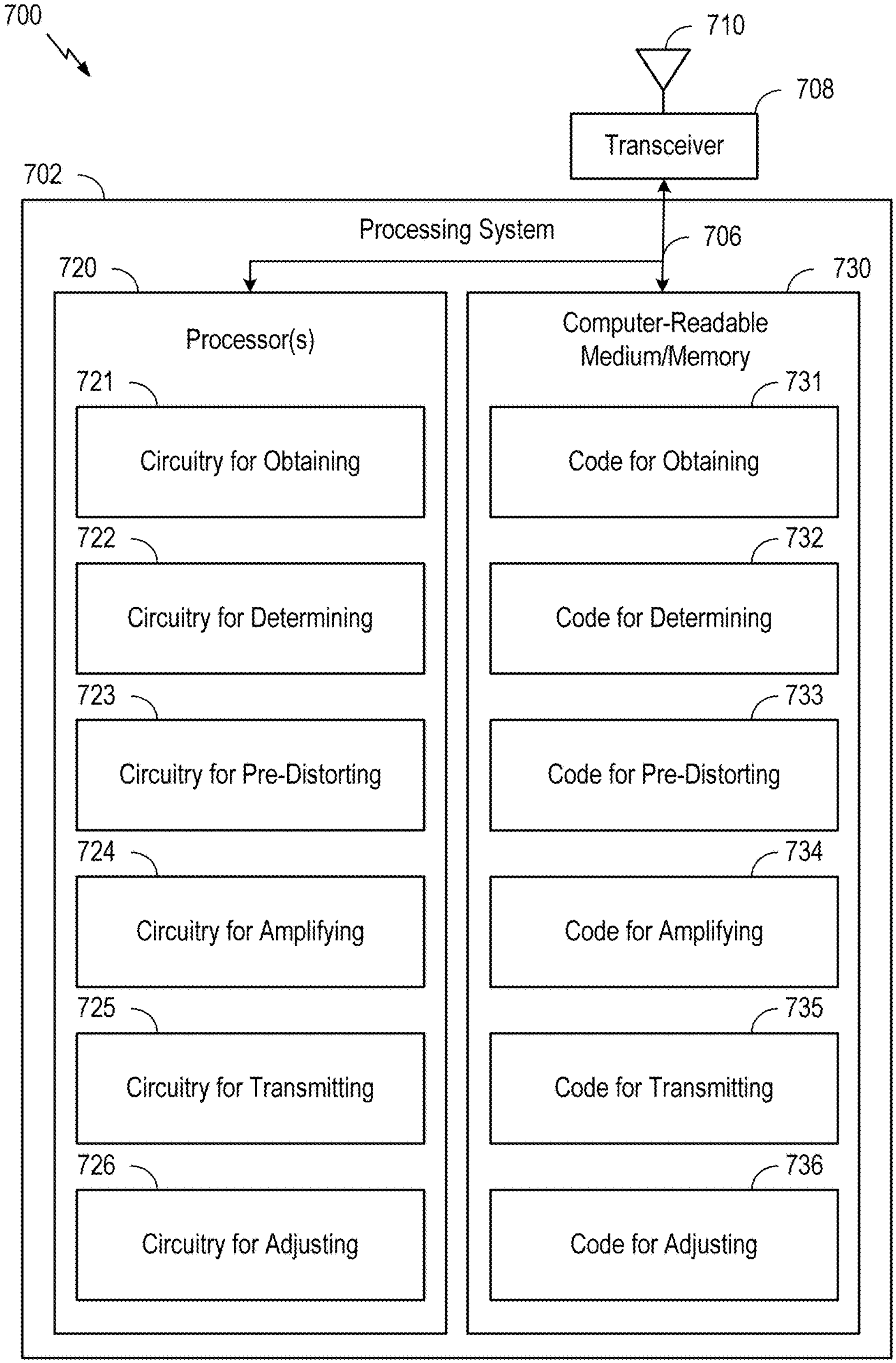
FIG. 7 illustrates a communications device that may include various components configured to perform operations for the techniques disclosed herein.

FIG. 7 depicts aspects of an example communications device 700. In some aspects, communications device 700 is a wireless communication device, such as the first wireless device 102 described above with respect to FIGS. 1 and 2.

The communications device 700 includes a processing system 702 coupled to a transceiver 708 (e.g., a transmitter and/or a receiver). The transceiver 708 is configured to transmit and receive signals for the communications device 700 via an antenna 710, such as the various signals described herein. The processing system 702 may be configured to perform processing functions for the communications device 700, including processing signals received and/or to be transmitted by the communications device 700.

The processing system 702 includes one or more processors 720. In various aspects, the one or more processors 720 may be representative of any of the modem 210 and/or the processor 212, as described with respect to FIG. 2. The one or more processors 720 are coupled to a computer-readable medium/memory 730 via a bus 706. In certain aspects, the computer-readable medium/memory 730 is configured to store instructions (e.g., computer-executable code) that when executed by the one or more processors 720, cause the one or more processors 720 to perform the operations 600 described with respect to FIG. 6, or any aspect related to the operations described herein. Note that reference to a processor performing a function of communications device 700 may include one or more processors performing that function of communications device 700. Reference to one or more processors performing multiple functions may include any one of the one or more processors performing any one of the multiple functions.

In the depicted example, computer-readable medium/memory 730 stores code (e.g., executable instructions) for obtaining 731, code for determining 732, code for pre-distorting 733, code for amplifying 734, code for transmitting 735, code for adjusting 736, or any combination thereof. Processing of the code 731-736 may cause the communications device 700 to perform the operations 600 described with respect to FIG. 6, or any aspect related to operations described herein.

The one or more processors 720 include circuitry configured to implement (e.g., execute) the code stored in the computer-readable medium/memory 730, including circuitry for obtaining 721, circuitry for determining 722, circuitry for pre-distorting 723, circuitry for amplifying 724, circuitry for transmitting 725, circuitry for adjusting 726, or any combination thereof. Processing with circuitry 721-726 may cause the communications device 700 to perform the operations 600 described with respect to FIG. 6, or any aspect related to operations described herein.

Various components of the communications device 700 may provide means for performing the operations 600 described with respect to FIG. 6, or any aspect related to operations described herein. For example, means for transmitting, sending or outputting for transmission may include the TX path 218 and/or antenna 220 of the first wireless device 102 illustrated in FIG. 2 and/or transceiver 708 and antenna 710 of the communications device 700 in FIG. 7. Means for receiving or obtaining may include the RX path 222 and/or antenna 220 of the first wireless device illustrated in FIG. 2 and/or transceiver 708 and antenna 710 of the communications device 700 in FIG. 7.

Means for obtaining, determining, pre-distorting, amplifying, and/or adjusting may include the inductive elements 342, 346, 442, 446 in FIGS. 3A, 3B, and 4; the PAs 230, 330, 430 in FIGS. 2, 3A, 3B, and 4; the pre-distortion manager 106 in FIGS. 1, and 2; and/or one or more processors, such as the modem 210 and/or processor 212 depicted in FIG. 2 and/or the processor(s) 720 in FIG. 7.

Example Aspects

Implementation examples are described in the following numbered clauses:

Aspect 1: An apparatus configured for wireless communications, comprising: a receive path comprising a variable resistive element; a transmit path comprising a first amplifier having a first output that is inductively coupled to the receive path; one or more memories; and one or more processors coupled to the one or more memories, the receive path, and the transmit path, wherein the one or more processors are configured to cause the apparatus to: obtain a first signal, based on a second signal output by the first amplifier, via the receive path being inductively coupled to the first output of the first amplifier, wherein the variable resistive element is configured to adjust an attenuation applied to the first signal via a variable resistance of the variable resistive element; determine one or more parameters for digital pre-distortion (DPD) associated with the first amplifier based at least in part on the first signal; pre-distort a third signal based at least in part on the one or more parameters; amplify the pre-distorted third signal via the first amplifier; and transmit the amplified third signal.

Aspect 2: The apparatus of Aspect 1, wherein the transmit path comprises a first inductive element coupled to the first output of the first amplifier and inductively coupled to the receive path.

Aspect 3: The apparatus of Aspect 2, wherein the first inductive element comprises a transformer.

Aspect 4: The apparatus of Aspect 2 or 3, wherein the receive path comprises a second inductive element inductively coupled to the first output of the first amplifier via the first inductive element being inductively coupled to the second inductive element.

Aspect 5: The apparatus of Aspect 4, wherein the receive path further comprises a second amplifier having a second output coupled to the second inductive element.

Aspect 6: The apparatus of Aspect 4 or 5, wherein the variable resistive element is coupled to the second inductive element.

Aspect 7: The apparatus of Aspect 6, wherein the variable resistive element comprises a resistor bank comprising a plurality of branches arranged in parallel, wherein each of the plurality of branches comprises a resistive element and a switch coupled in series.

Aspect 8: The apparatus of Aspect 6 or 7, wherein the one or more processors are configured to cause the apparatus to adjust the attenuation applied to the first signal via the variable resistive element.

Aspect 9: The apparatus according to any of Aspects 6-8, wherein the receive path further comprises: a second amplifier having a second output coupled to the second inductive element; and one or more mixers, wherein the second inductive element and the variable resistive element are coupled between the one or more mixers and the second output of the second amplifier.

Aspect 10: The apparatus of Aspect 9, wherein the receive path further comprises a transconductance amplifier coupled between the one or more mixers and the variable resistive element.

Aspect 11: The apparatus according to any of Aspects 1-10, wherein to determine the one or more parameters, the one or more processors are configured to cause the apparatus to determine the one or more parameters for the DPD based at least in part on a comparison between the first signal and a DPD training signal.

Aspect 12: The apparatus according to any of Aspects 1-11, wherein the one or more parameters comprises one or more of: one or more pre-distortion coefficients; an amplitude-to-phase modulation (AM-PM) conversion associated with the first amplifier; or an amplitude-to-amplitude modulation (AM-AM) conversion associated with the first amplifier.

Aspect 13: A method for wireless communications by an apparatus, comprising: obtaining a first signal, based on a second signal output by a first amplifier of a transmit path, via a receive path being inductively coupled to an output of the first amplifier, the receive path comprising a variable resistive element configured to adjust an attenuation applied to the first signal via a variable resistance of the variable resistive element; determining one or more parameters for digital pre-distortion (DPD) associated with the first amplifier based at least in part on the first signal; pre-distorting a third signal based at least in part on the one or more parameters; amplifying the pre-distorted third signal via the first amplifier; and transmitting the amplified third signal.

Aspect 14: The method of Aspect 13, wherein the transmit path comprises a first inductive element coupled to the first output of the first amplifier and inductively coupled to the receive path.

Aspect 15: The method of Aspect 14, wherein the first inductive element comprises a transformer.

Aspect 16: The method of Aspect 14 or 15, wherein the receive path comprises a second inductive element inductively coupled to the first output of the first amplifier via the first inductive element being inductively coupled to the second inductive element.

Aspect 17: The method of Aspect 16, wherein the receive path further comprises a second amplifier having a second output coupled to the second inductive element.

Aspect 18: The method of Aspect 16 or 17, wherein the variable resistive element is coupled to the second inductive element.

Aspect 19: The method of Aspect 18, wherein the variable resistive element comprises a resistor bank comprising a plurality of branches arranged in parallel, wherein each of the plurality of branches comprises a resistive element and a switch coupled in series.

Aspect 20: The method of Aspect 18 or 19, further comprising adjusting the attenuation applied to the first signal via the variable resistive element.

Aspect 21: The method according to any of Aspects 18-20, wherein the receive path further comprises: a second amplifier having a second output coupled to the second inductive element; and one or more mixers, wherein the second inductive element and the variable resistive element are coupled between the one or more mixers and the second output of the second amplifier.

Aspect 22: The method of Aspect 21, wherein the receive path further comprises a transconductance amplifier coupled between the one or more mixers and the variable resistive element.

Aspect 23: The method according to any of Aspects 13-22, wherein determining the one or more parameters comprises determining the one or more parameters for the DPD based at least in part on a comparison between the first signal and a DPD training signal.

Aspect 24: The method according to any of Aspects 13-23, wherein the one or more parameters comprises one or more of: one or more pre-distortion coefficients; an amplitude-to-phase modulation (AM-PM) conversion associated with the first amplifier; or an amplitude-to-amplitude modulation (AM-AM) conversion associated with the first amplifier.

Aspect 25: An apparatus configured for wireless communications, comprising: a receive path; a transmit path comprising a first amplifier having a first output that is inductively coupled to the receive path and is not physically coupled to the receive path; one or more memories; and one or more processors coupled to the one or more memories, the receive path, and the transmit path, wherein the one or more processors are configured to cause the apparatus to: obtain a first signal, based on a second signal output by the first amplifier, via the receive path being inductively coupled to the first output of the first amplifier; determine one or more parameters for digital pre-distortion (DPD) associated with the first amplifier based at least in part on the first signal; pre-distort a third signal based at least in part on the one or more parameters; amplify the pre-distorted third signal via the first amplifier; and transmit the amplified third signal.

Aspect 26: An apparatus configured for wireless communications, comprising: an antenna; and a receive path comprising: a low noise amplifier having an input coupled to the antenna and an output; a variable resistive element directly connected to the output of the low noise amplifier; an inductive element directly connected to the output of the low noise amplifier; and a downconversion mixer coupled to the output of the low noise amplifier.

Aspect 27: An apparatus configured for wireless communications, comprising: a receive path comprising a variable resistive element; one or more memories; and one or more processors coupled to the one or more memories and the receive path, wherein the one or more processors are configured to cause the apparatus to: determine one or more parameters for digital pre-distortion (DPD) based on a signal inductively received at the receive path during a DPD training mode; and adjust an attenuation applied to the inductively received signal via a variable resistance of the variable resistive element based on the DPD training mode.

Aspect 28: An apparatus configured for wireless communications, comprising: a receive path; a transmit path comprising a first amplifier having a first output that is inductively coupled to the receive path; one or more memories; and one or more processors coupled to the one or more memories, the receive path, and the transmit path, wherein the one or more processors are configured to cause the apparatus to: obtain a first signal, based on a second signal output by the first amplifier, via the receive path being inductively coupled to the first output of the first amplifier; determine one or more parameters for digital pre-distortion (DPD) associated with the first amplifier based at least in part on the first signal; pre-distort a third signal based at least in part on the one or more parameters; amplify the pre-distorted third signal via the first amplifier; and transmit the amplified third signal.

Aspect 29: The apparatus of Aspect 28, wherein the transmit path comprises a first inductive element coupled to the first output of the first amplifier and inductively coupled to the receive path.

Aspect 30: The apparatus of Aspect 29, wherein the first inductive element comprises a transformer.

Aspect 31: The apparatus of Aspect 29 or 30, wherein the receive path comprises a second inductive element inductively coupled to the first output of the first amplifier via the first inductive element being inductively coupled to the second inductive element.

Aspect 32: The apparatus of Aspect 31, wherein the receive path further comprises a second amplifier having a second output coupled to the second inductive element.

Aspect 33: The apparatus of Aspect 31 or 32, wherein the receive path further comprises a variable resistive element coupled to the second inductive element, wherein the variable resistive element is configured to adjust an attenuation applied to the first signal via a variable resistance of the variable resistive element.

Aspect 34: The apparatus of Aspect 33, wherein the variable resistive element comprises a resistor bank comprising a plurality of branches arranged in parallel, wherein each of the plurality of branches comprises a resistive element and a switch coupled in series.

Aspect 35: The apparatus of Aspect 33 or 34, wherein the one or more processors are configured to cause the apparatus to adjust the attenuation applied to the first signal via the variable resistive element.

Aspect 36: The apparatus according to any of Aspects 33-35, wherein the receive path further comprises: a second amplifier having a second output coupled to the second inductive element; and one or more mixers, wherein the second inductive element and the variable resistive element are coupled between the one or more mixers and the second output of the second amplifier.

Aspect 37: The apparatus of Aspect 36, wherein the receive path further comprises a transconductance amplifier coupled between the one or more mixers and the variable resistive element.

Aspect 38: The apparatus according to any of Aspects 28-37, wherein to determine the one or more parameters, the one or more processors are configured to cause the apparatus to determine the one or more parameters for the DPD based at least in part on a comparison between the first signal and a DPD training signal.

Aspect 39: The apparatus according to any of Aspects 28-38, wherein the one or more parameters comprises one or more of: one or more pre-distortion coefficients; an amplitude-to-phase modulation (AM-PM) conversion associated with the first amplifier; or an amplitude-to-amplitude modulation (AM-AM) conversion associated with the first amplifier.

Aspect 40: An apparatus configured for wireless communications, comprising: a receive path comprising a variable resistive element; one or more memories; and one or more processors coupled to the one or more memories and the receive path, wherein the one or more processors are configured to cause the apparatus to: determine one or more parameters for distortion compensation based on a first signal inductively received at the receive path during a first mode; and adjust a first attenuation, applied to the inductively received first signal, via a variable resistance of the variable resistive element based on the first mode.

Aspect 41: The apparatus of Aspect 40, wherein the receive path further comprises an inductive element configured to inductively receive the first signal.

Aspect 42: The apparatus of Aspect 40 or 41, wherein the one or more processors are configured to cause the apparatus to adjust a second attenuation applied to a second signal obtained via the receive path based on a second mode.

Aspect 43: The apparatus of Aspect 41 or 42, wherein the receive path further comprises: an amplifier having an output coupled to the inductive element; and one or more mixers, wherein the inductive element and the variable resistive element are coupled between the one or more mixers and the output of the amplifier.

Aspect 44: The apparatus of Aspect 43, wherein the receive path further comprises a transconductance amplifier coupled between the one or more mixers and the variable resistive element.

Aspect 45: The apparatus according to any of Aspects 40-44, wherein to determine the one or more parameters, the one or more processors are configured to cause the apparatus to determine the one or more parameters for the distortion compensation based at least in part on a comparison between the first signal and a training signal.

Aspect 46: The apparatus according to any of Aspects 40-45, wherein the variable resistive element comprises a resistor bank comprising a plurality of branches arranged in parallel, wherein each of the plurality of branches comprises a resistive element and a switch coupled in series.

Aspect 47: A method for wireless communications by an apparatus, comprising: obtaining a first signal, based on a second signal output by a first amplifier of a transmit path, via a receive path being inductively coupled to an output of the first amplifier; determining one or more parameters for digital pre-distortion (DPD) associated with the first amplifier based at least in part on the first signal; pre-distorting a third signal based at least in part on the one or more parameters; amplifying the pre-distorted third signal via the first amplifier; and transmitting the amplified third signal.

Aspect 48: An apparatus, comprising means for performing a method in accordance with any of Aspects 13-24 or 47.

Aspect 49: A non-transitory computer-readable medium comprising computer-executable instructions that, when executed by one or more processors of a processing system, cause the processing system to perform a method in accordance with any of Aspects 13-24 or 47.

Aspect 50: A computer program product embodied on a computer-readable storage medium comprising code for performing a method in accordance with any of Aspects 13-24 or 47.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented, or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a microcontroller, a microprocessor, a general-purpose processor, a digital signal processor (DSP), an artificial intelligence processor, an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, identifying, mapping, applying, choosing, establishing, and the like. As used herein, "coupled to" and "coupled with" generally encompass direct coupling and indirect coupling (e.g., including intermediary coupled aspects) unless stated otherwise. For example, stating that a processor is coupled to a memory allows for a direct coupling or a coupling via an intermediary aspect, such as a bus.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an ASIC, or processor.

The following claims are not intended to be limited to the aspects shown herein but are to be accorded the full scope consistent with the language of the claims. Reference to an element in the singular is not intended to mean only one unless specifically so stated, but rather "one or more." The subsequent use of a definite article (e.g., "the" or "said") with an element (e.g., "the processor") is not intended to invoke a singular meaning (e.g., "only one") on the element unless otherwise specifically stated. For example, reference to an element (e.g., "a processor," "a controller," "a memory," "a transceiver," "an antenna," "the processor," "the controller," "the memory," "the transceiver," "the antenna," etc.), unless otherwise specifically stated, should be understood to refer to one or more elements (e.g., "one or more processors," "one or more controllers," "one or more memories," "one more transceivers," etc.). The terms "set" and "group" are intended to include one or more elements, and may be used interchangeably with "one or more." Where reference is made to one or more elements performing functions (e.g., steps of a method), one element may perform all functions, or more than one element may collectively perform the functions. When more than one element collectively performs the functions, each function need not be performed by each of those elements (e.g., different functions may be performed by different elements) and/or each function need not be performed in whole by only one element (e.g., different elements may perform different sub-functions of a function). Similarly, where reference is made to one or more elements configured to cause another element (e.g., an apparatus) to perform functions, one element may be configured to cause the other element to perform all functions, or more than one element may collectively be configured to cause the other element to perform the functions. Unless specifically stated otherwise, the term "some" refers to one or more. All structural and functional equivalents to the elements of the various aspects described throughout this disclosure that are known or later come to be known to those of ordinary skill in the art are intended to be encompassed by the claims. Moreover, nothing disclosed herein is intended to be dedicated to the public regardless of whether such disclosure is explicitly recited in the claims.

The invention claimed is:

1. An apparatus configured for wireless communications, comprising:

a receive path comprising a first inductive element that includes an inductor;

a transmit path comprising a first amplifier and a second inductive element coupled to an output of the first amplifier, wherein the first inductive element is inductively coupled to the second inductive element wherein the receive path further comprises one of more mixers and a second amplifier having an output coupled to the first inductive element, wherein the first inductive element is coupled between the one or more mixers and the output of the second amplifier;

one or more memories; and one or more processors coupled to the one or more memories, the receive path, and the transmit path, wherein the one or more processors are configured to cause the apparatus to:

obtain a first signal, based on a second signal output by the first amplifier, via the first inductive element being inductively coupled to the second inductive element;

determine one or more parameters for digital pre-distortion (DPD) associated with the first amplifier based at least in part on the first signal;

pre-distort a third signal based at least in part on the one or more parameters;

amplify the pre-distorted third signal via the first amplifier; and transmit the amplified third signal.

2. The apparatus of claim 1, wherein the second inductive element comprises a transformer.

3. The apparatus of claim 1, wherein the receive path further comprises a variable resistive element coupled to the first inductive element, wherein the variable resistive element is configured to adjust an attenuation applied to the first signal via a variable resistance of the variable resistive element.

4. The apparatus of claim 3, wherein the variable resistive element comprises a resistor bank comprising a plurality of branches arranged in parallel, wherein each of the plurality of branches comprises a resistive element and a switch coupled in series with the resistive element.

5. The apparatus of claim 3, wherein the one or more processors are configured to cause the apparatus to adjust the attenuation applied to the first signal via the variable resistive element.

6. The apparatus of claim 3, wherein the first inductive element and the variable resistive element are coupled between the one or more mixers and the output of the second amplifier.

7. The apparatus of claim 6, wherein the receive path further comprises a transconductance amplifier coupled between the one or more mixers and the variable resistive element.

8. The apparatus of claim 1, wherein to determine the one or more parameters, the one or more processors are configured to cause the apparatus to determine the one or more parameters for the DPD based at least in part on a comparison between the first signal and a DPD training signal.

9. The apparatus of claim 1, wherein the one or more parameters comprise one or more of:

one or more pre-distortion coefficients;

an amplitude-to-phase modulation (AM-PM) conversion associated with the first amplifier; or an amplitude-to-amplitude modulation (AM-AM) conversion associated with the first amplifier.

10. An apparatus configured for wireless communications, comprising:

a receive path comprising a variable resistive element, and a first inductive element that includes an inductor;

a transmit path comprising a first amplifier and a second inductive element coupled to an output of the first amplifier, wherein the second inductive element is arranged to be inductively coupled to the first inductive element, wherein the receive path further comprises one or more mixers and a second amplifier having an output coupled to the first inductive element, wherein the first inductive element is coupled between the one or more mixers and the output of the second amplifier;

one or more memories; and one or more processors coupled to the one or more memories and the receive path, wherein the one or more processors are configured to cause the apparatus to:

determine one or more parameters for distortion compensation based on a first signal inductively received at the receive path, via the first inductive element being inductively coupled to the second inductive element, during a first mode; and adjust a first attenuation, applied to the inductively received first signal, via a variable resistance of the variable resistive element based on the first mode.

11. The apparatus of claim 10, wherein the one or more processors are further configured to cause the apparatus to adjust a second attenuation applied to a second signal obtained via the receive path based on a second mode.

12. The apparatus of claim 10, wherein the first inductive element and the variable resistive element are coupled between the one or more mixers and the output of the second amplifier.

13. The apparatus of claim 12, wherein the receive path further comprises a transconductance amplifier coupled between the one or more mixers and the variable resistive element.

14. The apparatus of claim 10, wherein to determine the one or more parameters, the one or more processors are configured to cause the apparatus to determine the one or more parameters for the distortion compensation based at least in part on a comparison between the first signal and a training signal.

15. The apparatus of claim 10, wherein the variable resistive element comprises a resistor bank comprising a plurality of branches arranged in parallel, wherein each of the plurality of branches comprises a resistive element and a switch coupled in series with the resistive element.

16. A method for wireless communications by an apparatus, comprising:

obtaining a first signal, based on a second signal output by a first amplifier of a transmit path, via a first inductive element of a receive path being inductively coupled to a second inductive element of the transmit path, wherein the first inductive element includes an inductor, and wherein the second inductive element is coupled to an output of the first amplifier, wherein the receive path comprises one or more mixers and a second amplifier having an output coupled to the first inductive element, wherein the first inductive element is coupled between the one or more mixers and the output of the second amplifier;

determining one or more parameters for digital pre-distortion (DPD) associated with the first amplifier based at least in part on the first signal;

pre-distorting a third signal based at least in part on the one or more parameters;

amplifying the pre-distorted third signal via the first amplifier; and transmitting the amplified third signal.

* * * * *